(12) United States Patent
Pickerd et al.

(10) Patent No.: US 7,206,722 B2
(45) Date of Patent: Apr. 17, 2007

(54) OSCILLOSCOPE HAVING AN ENHANCEMENT FILTER

(75) Inventors: John J. Pickerd, Beaverton, OR (US); Kan Tan, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/097,568

(22) Filed: Apr. 1, 2005

(65) Prior Publication Data

US 2006/0224365 A1 Oct. 5, 2006

(51) Int. Cl.
*G06F 3/02* (2006.01)

(52) U.S. Cl. .............. 702/190; 702/189; 702/194; 702/197

(58) Field of Classification Search .............. 702/67, 702/98, 106, 123, 189, 190, 194, 197; 324/121; 345/134; 704/208
See application file for complete search history.

(56) References Cited

U.S. PATENT DOCUMENTS

| | | | |
|---|---|---|---|
| 5,978,742 A * | 11/1999 | Pickerd .................. | 702/66 |
| 6,111,400 A * | 8/2000 | Foster et al. ............ | 324/121 R |
| 6,234,658 B1 * | 5/2001 | Houldsworth ............ | 716/4 |
| 6,459,256 B1 * | 10/2002 | Pickerd .................. | 324/121 R |
| 6,473,701 B1 * | 10/2002 | Tallman et al. .......... | 702/67 |
| 6,542,914 B1 | 4/2003 | Pupalaikis ............... | 708/300 |

OTHER PUBLICATIONS

White Paper: "DSP in High Performance Oscilloscopes", John J. Pickerd, Tektronix, Inc., Copyright 2004.
White Paper: "Advantages and Disadvantages of Using DSP Filtering on Oscilloscope Waveforms", Agilent Technologies, Inc., Copyright 2004.

* cited by examiner

*Primary Examiner*—Marc Hoff
*Assistant Examiner*—Felix Suarez
(74) *Attorney, Agent, or Firm*—Kenneth J. Cool; Thomas F. Lenihan

(57) ABSTRACT

An enhancement filter for an oscilloscope is disclosed wherein the enhancement filter may be initially calibrated for one or more channels and/or for one or more attenuation settings such as 50 mV per division, 100 mV per division, and/or 200 mV per division, for example. In one embodiment, a desired filter response is selected to have a modified Gaussian type filter function having an at least approximately linear phase response, wherein the transfer function of the desired filter response comprises a step response that is be stored in the oscilloscope to be used as a part of calibration system of the oscilloscope.

9 Claims, 7 Drawing Sheets

US 7,206,722 B2

OSCILLOSCOPE HAVING AN ENHANCEMENT FILTER

BACKGROUND

Since the wide-spread introduction of digital signal processing in the early 1980's and the proliferation of digital signal processing microprocessors, oscilloscope manufacturers have been phasing out analog circuitry in favor of digital circuitry in various portions of the oscilloscope. Oscilloscopes that employ digital technology, such as digital signal processing, continue to be desirable.

DESCRIPTION OF THE DRAWING FIGURES

Claimed subject matter is particularly pointed out and distinctly claimed in the concluding portion of the specification. However, both as to organization and/or method of operation, together with objects, features, and/or advantages thereof, may best be understood by reference to the following detailed description when read with the accompanying drawings in which:

Figure 7:
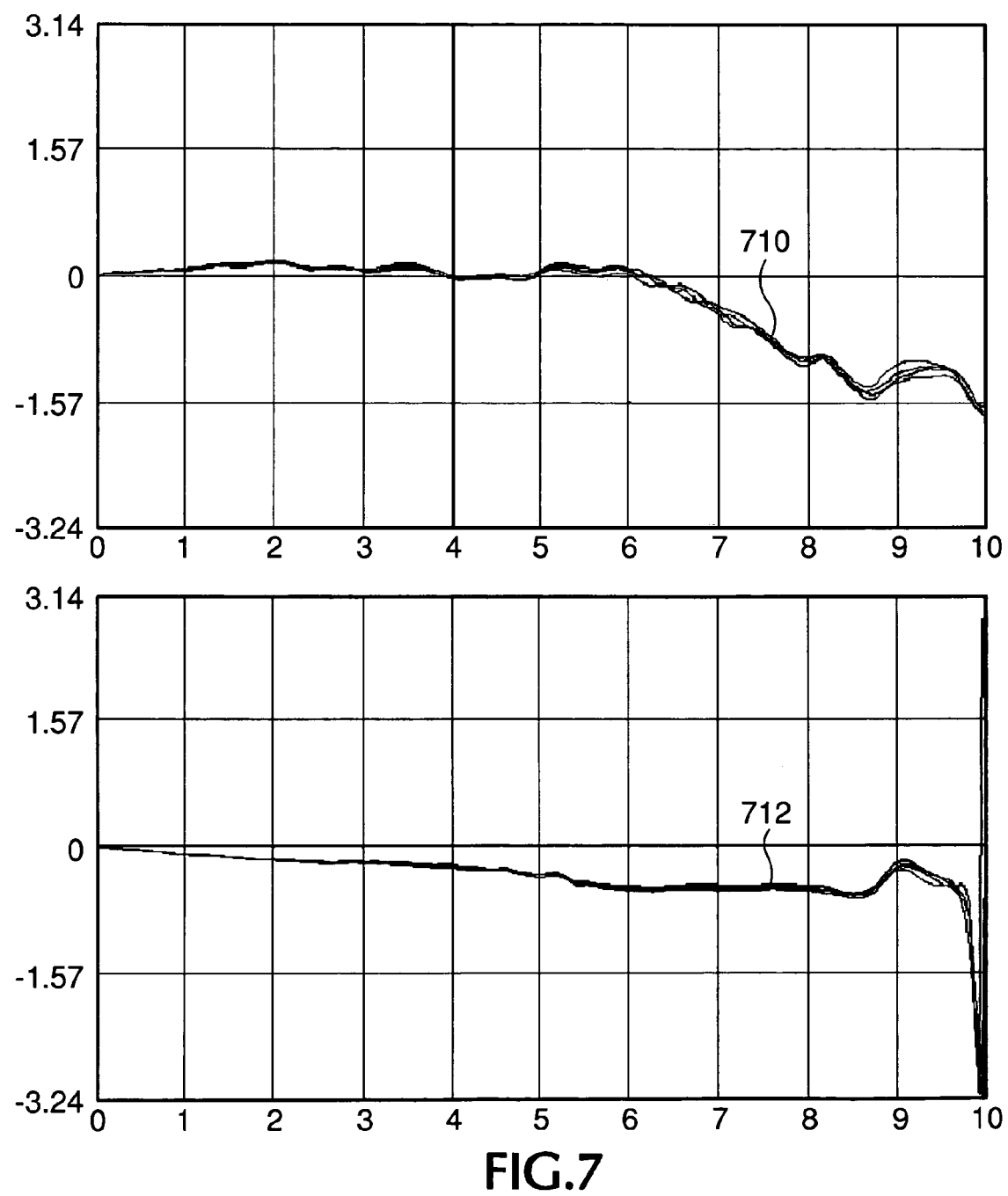
Figure 8:
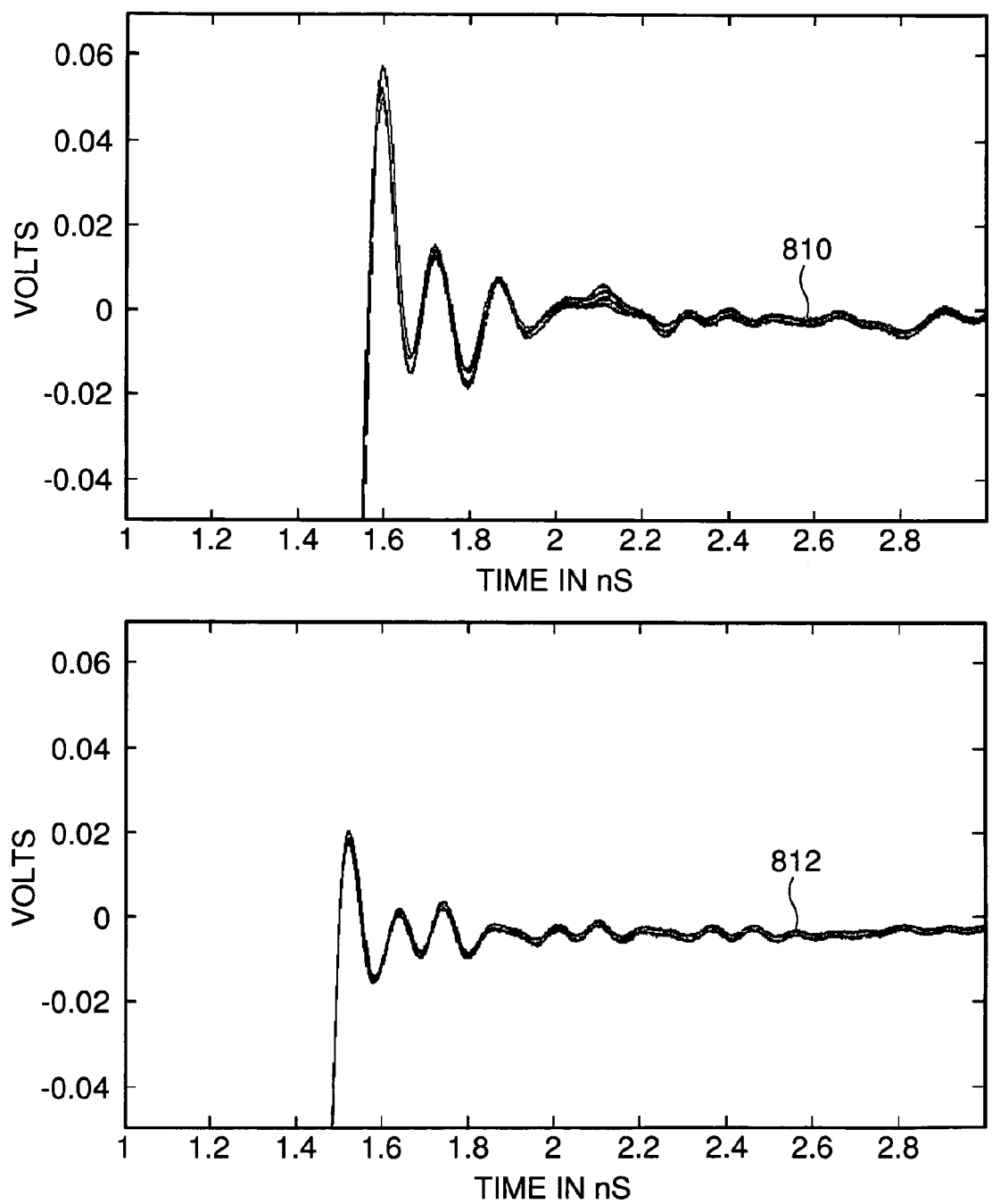

FIG. 7 is a graph depicting a phase response of a channel of a digital oscilloscope with no enhancement filter compared with the phase response of the channel with an enhancement filter in accordance with one or more embodiments; and FIG. 8 is a graph depicting an expanded view of a time domain step response of a channel of an oscilloscope including no enhancement filter compared with a time domain step response of the channel of an oscilloscope including an enhancement filter in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Some portions of the detailed description that follows are presented in terms of algorithms, programs and/or symbolic representations of operations on data bits or binary digital signals within a computer memory, for example. These algorithmic descriptions and/or representations may include techniques used in the data processing arts to convey the arrangement of a computer system and/or other information handling system to operate according to such programs, algorithms, and/or symbolic representations of operations.

An algorithm may be generally considered to be a self-consistent sequence of acts and/or operations leading to a desired result. These include physical manipulations of physical quantities. Usually, though not necessarily, these quantities take the form of electrical and/or magnetic signals capable of being stored, transferred, combined, compared, and/or otherwise manipulated. It has proven convenient at times, principally for reasons of common usage, to refer to these signals as bits, values, elements, symbols, characters, terms, numbers and/or the like. It should be understood, however, that all of these and/or similar terms are to be associated with the appropriate physical quantities and are merely convenient labels applied to these quantities.

Unless specifically stated otherwise, as apparent from the following discussions, it is appreciated that throughout the specification discussion utilizing terms such as processing, computing, calculating, determining, and/or the like, refer to the action and/or processes of a computer and/or computing system, and/or similar electronic computing device, that manipulate or transform data represented as physical, such as electronic, quantities within the registers and/or memories of the computer and/or computing system and/or similar electronic and/or computing device into other data similarly represented as physical quantities within the memories, registers and/or other such information storage, transmission and/or display devices of the computing system and/or other information handling system.

Embodiments claimed may include apparatuses for performing the operations herein. This apparatus may be specially constructed for the desired purposes, or it may comprise a general purpose computing device selectively activated and/or reconfigured by a program stored in the device. Such a program may be stored on a storage medium, such as, but is not limited to, any type of disk including floppy disks, optical disks, CD-ROMs, magnetic-optical disks, read-only memories (ROMs), random access memories (RAMs), electrically programmable read-only memories (EPROMs), electrically erasable and/or programmable read only memories (EEPROMs), flash memory, magnetic and/or optical cards, and/or any other type of media suitable for storing electronic instructions, and/or capable of being coupled to a system bus for a computing device and/or other information handling system.

The processes and/or displays presented herein are not inherently related to any particular computing device and/or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments are not described with reference to any particular programming language. It will be appreciated that a variety of programming languages may be used to implement the teachings described herein.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other.

Although oscilloscopes utilize digital signal processing techniques for signal analysis, the front end of such oscilloscopes typically may remain analog up to the point of analog-to-digital conversion where the analog front end may exhibit an analog bandwidth based at least in part on the input amplifier and analog-to-digital conversion which may be subject to the effects of tolerance variations, temperature drift, and aging typically associated with analog circuits. Limitations of an analog front end may therefore adversely affect the performance of the digital operation of an oscilloscope. As a result, the bandwidth of the analog front end may be a limitation on the performance of the oscilloscope.

Figure 1:
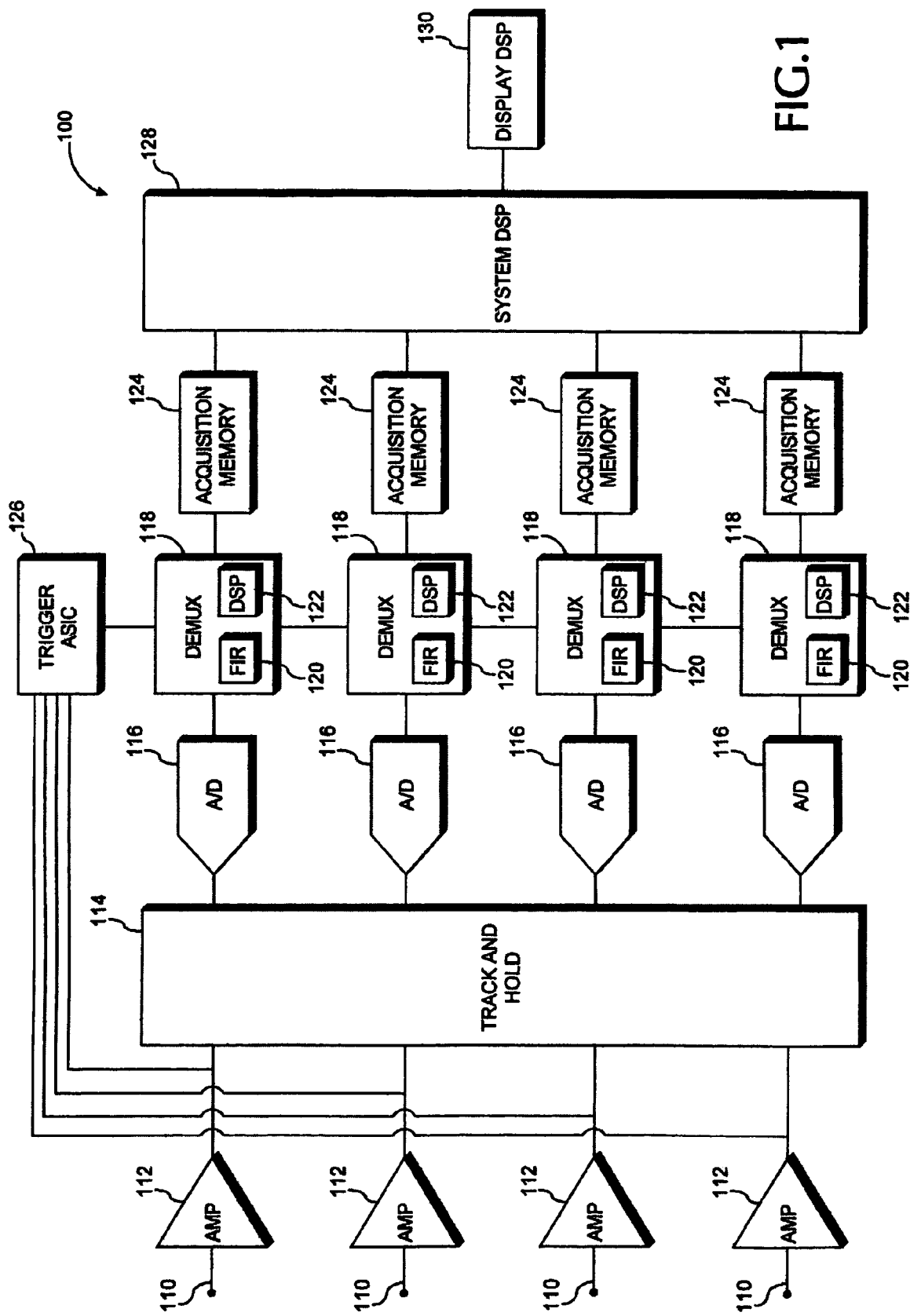
FIG. 1 is a block diagram of an oscilloscope having an enhanced bandwidth filter in accordance with one or more embodiments.

Referring now to FIG. 1, a block diagram of an oscilloscope having an enhanced bandwidth filter in accordance with one or more embodiments is illustrated. As shown in FIG. 1, oscilloscope 100 may have one or more channels 110 that may include an analog amplifier 112 and optionally an attenuator (not shown) to receive one or more input signals to be analyzed by oscilloscope 100. An oscilloscope may include an instrument or electronic device capable of receiving, analyzing, and/or displaying a representation of electronic and/or optical signal where the representation may include a representation of voltage and/or current with respect to time, and which may include periodic signals, or may include a representation of a first signal with respect to a second signal. An analog oscilloscope may include an oscilloscope that may utilize an amplifier to drive a trace of an input signal on a display, such as a cathode ray tube display. A storage oscilloscope may include an oscilloscope that is capable of storing a signal for continuous display of the signal even after the signal has decayed or has been removed from an input of the oscilloscope. A digital storage oscilloscope may include an oscilloscope that may digitize an input signal and is capable of storing the digitized input signal in an electronic memory accessible by a digital processor. A digital storage oscilloscope may include software to perform signal analysis on an input signal, for example, time domain analysis, frequency domain and/or spectral analysis, statistical analysis, histograms, and/or other types of signal analysis. A channel of an oscilloscope may include a path having circuitry to receive and/or process an input signal. Typical oscilloscopes may include two or more channels to receive and/or process two or more input signals simultaneously. An oscilloscope having two or more channels may display voltage and/or phase relationships between two or more input signals, for example, as Lissajous traces. An enhanced bandwidth filter generally may be defined as a filter utilized to alter a response of a circuit or a channel in which such alteration may include, but not be limited to, alteration of a frequency bandwidth characteristic, a pass-band ripple characteristic, a frequency roll-off characteristic, a phase characteristic, a time domain characteristic, a frequency domain characteristic, a signal shape and/or shaping characteristic, a cut-off frequency characteristic, an attenuation band characteristic, a slew characteristic, and/or an overshoot and/or an undershoot characteristic, although the scope of the claimed subject matter is not limited in this respect. In one or more embodiments, oscilloscope 100 may comprise a digital storage oscilloscope, although the scope of the claimed invention is not limited in this respect.

A signal applied to an input of channel 110 may feed into a track and hold circuit 114 which may be embodied as an integrated circuit (IC). Track and hold circuit 114 may receive the analog output signal from amplifier 12 on one or more of channels 110 of oscilloscope 100. Track and hold circuit 114 may operate as an analog switch to route the signals to one or more analog-to-digital (A/D) converters 116 disposed in channels 110. In one embodiment, oscilloscope 100 may provide four channel operation wherein an amplifier 112 is connected to a corresponding A/D converter 116 for that corresponding channel 110. In an alternative embodiment, an oscilloscope may provide interleave operation to increase the sample rate wherein at least one channel 110 may be connected to two or more of A/D converters 116, and A/D converters 116 may have their sample clocks skewed accordingly. In one or more embodiments, A/D converters 116 may operate at a peak sample rate, and, in some embodiments, may provide an 8-bit wide word, although the scope of the claimed subject matter is not limited in this respect. It is noted that FIG. 1 depicts a particular architecture, but any architecture having an analog front end and a digital filter is included within the scope of the claimed subject matter.

Continuing with this particular example, the output signals of A/D converters 116 may feed into a respective demultiplexer (DEMUX) 118, which may for example be embodied in an integrated circuit as illustrated. DEMUX 118 may perform one or several different functions, and, in one embodiment, DEMUX 118 may receive samples of a signal on a channel 110 from an A/D converter 116 at the rate of the A/D converter write the samples to an acquisition memory 124 at a rate matching and/or slower than a rate of A/D converter 116. In one embodiment, for example, DEMUX 118 may write 16 or 32 samples at a time to acquisition memory 124. Furthermore, DEMUX 118 may also include various digital signal processors (DSP) implemented in hardware, and DEMUX may include a dedicated DSP circuit 122 or chip. The various digital signal processors and/or DSP circuits 122 may include, for example, bandwidth enhancement filtering, a higher resolution acquisition mode filter, envelope mode acquisition, and trigger position calculations, although the scope of the claimed subject matter is not limited in this respect. In accordance with one or more embodiments, DEMUX 118 may include a filter 120 to provide enhanced channel bandwidth, which in one or more embodiments may be a finite impulse response filter (FIR), although the scope of the claimed subject matter is not limited in this respect.

In one or more embodiments, acquisition memory 124 may be a different block than the main memory (not shown) for system DSP 128. DEMUX 118 may have a circular addressing and control logic and may receive triggers from a trigger system 126. In one embodiment, trigger system 126 may comprise an applications specific integrated circuit (ASIC), although the scope of the claimed subject matter is not limited in this respect. The data stream of signal samples may be continuously written in a circular fashion wherein past data may be overwritten past until a trigger event occurs. After a desired amount of post trigger data is captured by DEMUX 118 and written to acquisition memory 124, DEMUX 118 may cease to write to acquisition memory 124. Once the data is acquired by acquisition memory, system DSP 128 may then perform one or more digital signal processing operations on the data. Furthermore, data may be passed back from system DSP through DEMUX 118 to perform additional DSP operations, although the scope of the claimed subject matter is not limited in this respect.

Figure 2:
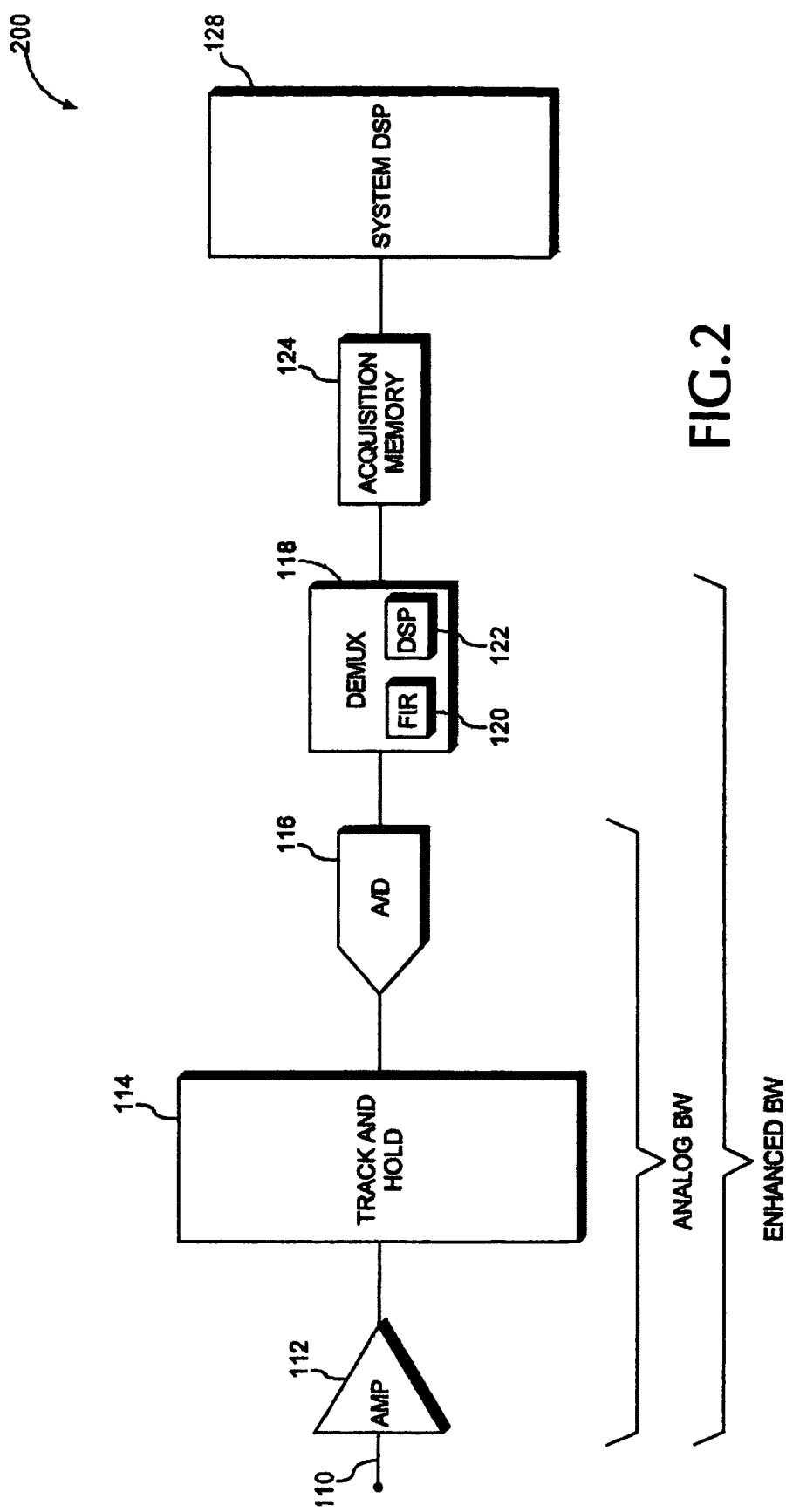
FIG. 2 is a block diagram of a channel circuit of an oscilloscope having an enhanced bandwidth filter in accordance with one or more embodiments.
Figure 3:
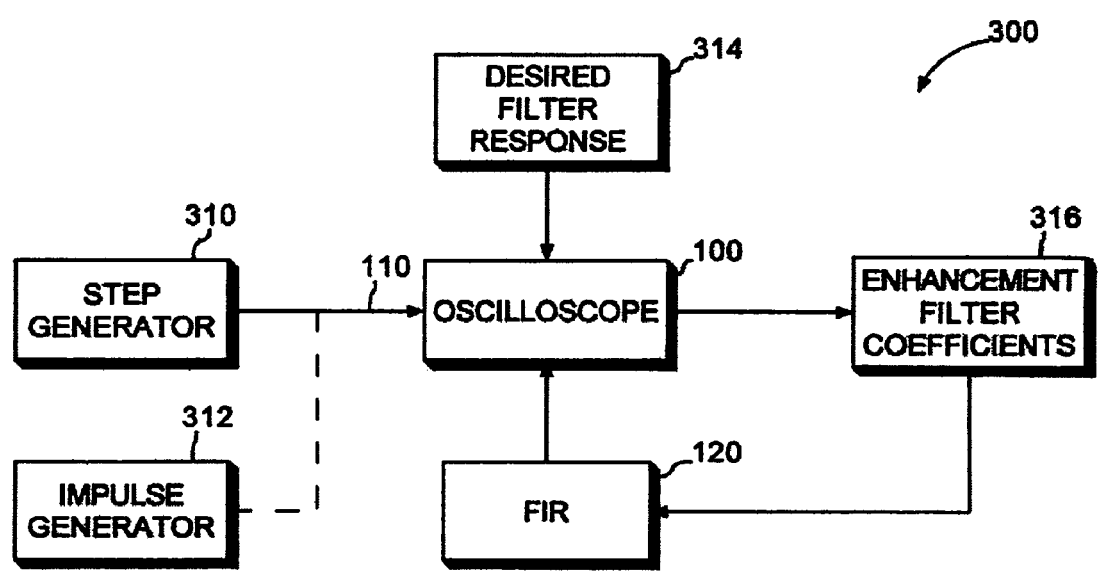
FIG. 3 is block diagram of a calibration system to be utilized to determine an enhancement filter response for an oscilloscope in accordance with one or more embodiments.

Referring now to FIG. 2, a block diagram of a channel circuit of an oscilloscope having an enhanced bandwidth filter in accordance with one or more embodiments will be discussed. As shown in FIG. 2, channel circuit 200 may correspond to one or more of channels 110 of oscilloscope 100 of FIG. 1. Thus, channel circuit 200 may include amplifier 112, track and hold circuit 114, A/D converter 116, DEMUX 118, filter 120, DSP circuit 122, acquisition memory 124 and system DSP of oscilloscope 100 of FIG. 1, for example. The analog bandwidth of channel 110 may include amplifier 112, track and hold circuit 114, and A/D converter 116 as shown in FIG. 2 labeled as ANALOG BW. This analog bandwidth may be based at least in part on the response of circuit components in this portion of channel circuit 200. An enhanced bandwidth of channel 110 may be extended to include, in addition to the response of the circuit components in the analog bandwidth portion of channel circuit, the bandwidth of DEMUX 118 as shown in FIG. 3 labeled as ENHANCED BW. Filter 120 in this embodiment may have a response selected to provide a bandwidth that is enhanced from the analog bandwidth as discussed herein with respect to one or more embodiments. It should be noted that enhanced bandwidth may refer to alteration of one or more response characteristics, including but not limited to a frequency bandwidth characteristic, a pass-band ripple characteristic, a frequency roll-off characteristic, a phase characteristic, a time domain characteristic, a frequency domain characteristic, a signal shape and/or shaping characteristic, a cut-off frequency characteristic, an attenuation band characteristic, a slew characteristic, and/or an overshoot and/or an undershoot characteristic, although the scope of the claimed subject matter is not limited in this respect.

Referring now to FIG. 3, a calibration system may be utilized in one or more embodiments to determine an enhancement filter response for an oscilloscope in accordance with one or more embodiments. As shown in FIG. 3, calibration system 300 may be utilized to calibrate oscilloscope 100 to provide an enhanced bandwidth via an enhancement filter 120. During one embodiment of a calibration process, a step generator 310 may be applied to one of the channels 110 of oscilloscope 100. A step generator may include a device that may provide a step output signal or an approximately step shaped output signal, although the scope of the claimed invention is not limited in this respect. Step generator 310 may provide a step signal to channel 110 to determine a step response of channel 110. A desired channel filter response 314 may have been previously designed as an ideal response for channel 110. However, since the actual response of channel 110 may differ from the ideal response, the actual channel step response as measured by oscilloscope 100 using step generator 310, and may be utilized along with desired filter response 314 to determine a response of an enhancement filter 120 that, if applied to channel 110 along with the actual response of channel 110, will more closely approximate the ideal response. As will be discussed in more detail herein, enhancement filter coefficients 316 may be computed for enhancement filter 120 programmed into oscilloscope 100 for enhanced bandwidth operation, although the scope of the claimed subject matter is not limited in this respect. In an alternative embodiment, an impulse generator 312 may be utilized to apply an impulse signal to channel 110 during calibration of oscilloscope 100, and desired filter response 314 may comprise an impulse response of a desired filter, wherein an impulse response of channel 110 may be utilized to compute enhancement filter coefficients 316 for enhancement filter 120, although the scope of the claimed subject matter is not limited in this respect. An impulse generator may include a device that may provide an impulse output signal or an approximately impulse shaped output signal, although the scope of the claimed invention is not limited in this respect. Likewise, any other combination of any driving functions may be employed.

To arrive at a desired filter response 314 for oscilloscope 100, a desired frequency and/or phase response for oscilloscope 100 may be selected. In one embodiment, desired filter response 314 may be selected to have a Gaussian type filter response, or, alternatively, may be selected to have a Bessel Thompson type filter response. In one particular embodiment, desired filter response 314 may be selected to have a modified Gaussian type filter function that may be selected to have an at least approximately linear phase response. In such an embodiment, the transfer function of desired filter response 314 may be fine tuned for a step response, although the scope of the claimed subject matter is not limited in this respect. In one embodiment, desired filter response 314 may comprise a step response of a desired filter that may be stored in oscilloscope 100 to be used as a part of calibration system 300. Such a response may be utilized to perform calibration of oscilloscope 100, for example. It is noted that such responses may be characterized numerically, graphically, theoretically, and/or other than in a closed form. In one embodiment, desired filter response 314 may be selected to comply with one or more Synchronous Optical Network (SONET) and/or Fibre Channel standards for optical filter reference receivers, which, for example, may comprise a $4^{th}$ order Bessel Thompson type filter, although the scope of the claimed subject matter is not limited in this respect. In such an embodiment, such a desired filter response 314 may have the following transfer function, for example:

$$H(s) = \frac{105}{s^4 + 10s^3 + 45s + 105}$$

In such an embodiment, desired filter response 314 may be selected to have a passband tolerance of +/−0.3 dB or alternatively +/−0.5 dB. At 1.5 times the bit rate, the passband tolerance may be +/−3 dB, although the scope of the claimed subject matter is not limited in this respect.

In one embodiment, enhancement filter 120 may comprise a finite impulse response filter (FIR). Alternatively, enhancement filter 120 may comprise an infinite impulse response (IIR) filter, although the scope of the claimed subject matter is not limited in this respect. In one embodiment, enhancement filter 120 may be an FIR filter to provide an at least approximately linear phase response, although the scope of the claimed subject matter is not limited in this respect. In one embodiment, a set of enhancement filter coefficients 316 may be computed at least in part based on a measured response of channel 110 for various settings and/or channels, for example, although the scope of the claimed subject matter is not limited in this respect.

Figure 4:
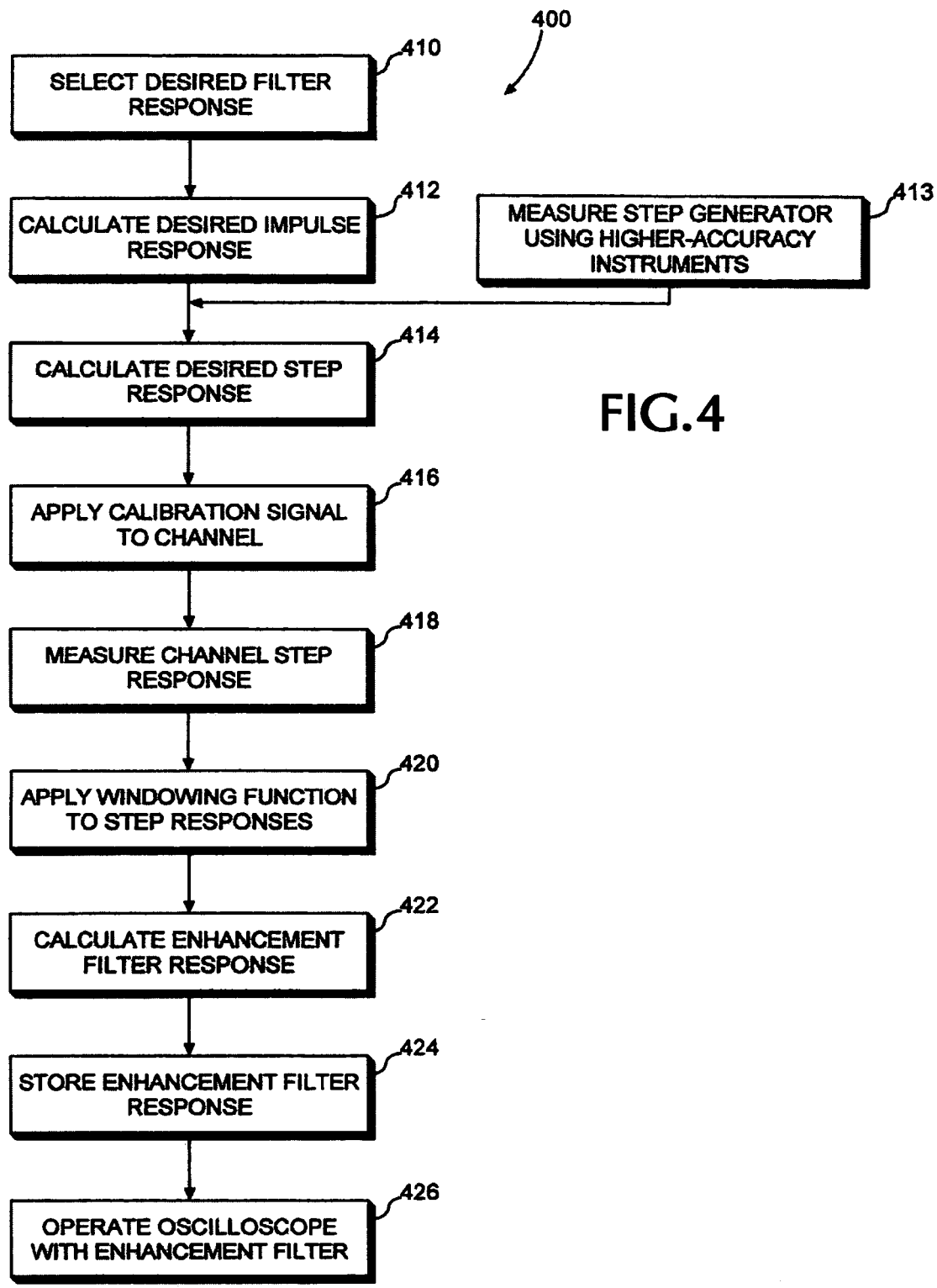
FIG. 4 is a flow diagram of a method to determine an enhancement filter response for an oscilloscope in accordance with one or more embodiments.

Referring now to FIG. 4, a flow diagram of a method to determine an enhancement filter response for an oscilloscope in accordance with one or more embodiments will be discussed. As shown in FIG. 4, method 400 may include selecting a desired filter response 314 at block 410. The characteristic of channel 110 may be described by an impulse response h(t) in a time domain or by a transfer function H(ω) in a frequency domain, although again it is noted that such responses may be characterized numerically, graphically, theoretically, and/or other than in a closed form. The actual response of channel 110 of oscilloscope 100 may be denoted as $h_{channel}$, the response of enhancement filter 120 may be denoted as $h_{filter}$, and the desired filter response 314 may be denoted as $h_{desired}$. The actual response of channel 110, enhancement filter 120, and desired filter response 314 may therefore be described by the following relationship:

$$h_{channel} * h_{filter} = h_{filter}$$

Using the above relationship, enhancement filter coefficients 316 may be determined based at least in part on the response of channel 110 determined at least in part by measurement during calibration. Several techniques may be to arrive at the response for enhancement filter 120, including for example cross-correlation, deconvolution in a time domain or deconvolution in a frequency domain, and/or or a hormomorphic deconvolution method, although the scope of the claimed subject matter is not limited in this respect.

For example, in one embodiment in which a step signal, for example, is fed into channel 110 using step generator 310, oscilloscope 100 may measure the step response of channel 110, denoted as $y_{channel}$. The step response of channel 110 resulting from such a measurement comprises the determined step response of the channel, denoted as $y_{channelr}$, plus measurement noise of the channel, denoted as $n_{channel}$, to result in the following relationship:

$$y_{channel} = y_{channelr} + n_{channel}$$

The impulse response of the channel likewise may be obtained via differentiation to result in:

$$h_{channel} = h_{channelr} + \dot{n}_{channel}$$

The measurement noise of the channel typically may have a significant amount of energy at higher frequencies, thus such differentiation may magnify the noise so that $\dot{n}_{channel}$ may have greater magnitude than $n_{channel}$. In one embodiment, however, the impulse response relationship may be integrated to arrive at the following relationship:

$$y_{channel} * h_{filter} = y_{desired}$$

wherein the step response of the channel $y_{channel}$ convolved with the impulse response of enhancement filter 120 comprises the step response of the desired filter response 314 in this embodiment. Thus, in one embodiment, measurement of a step response of channel 110 may be utilized to obtain the impulse response of enhancement filter 120. Since here the step response of channel is measured but not differentiated, the measurement noise of the channel may result in less noise error during calibration, although the scope of the claimed subject matter is not limited in this respect.

Thus, in one embodiment, a desired impulse response of enhancement filter 120 may be calculated at block 412 from a selected frequency response of a desired filter response 314. Likewise, a desired step response may be calculated at block 414 from the impulse response. Optionally, an output signal of step generator 310 may be measured at block 413 using one or more instruments. For example, such higher-accuracy instruments may include a higher bandwidth sampling oscilloscope, power meter, and/or spectrum analyzer. Using such higher accuracy instruments may at least in part account for the situation in which step generator 310 may only approximate an ideal step signal. Thus to account for a non-ideal step output signal from step generator 310, a desired step response may be calculated as a convolution of the output signal of block 413, which is the measured step output signal from step generator 310, with the output signal of block 412, which is a desired impulse response. A calibration signal may be applied to channel 110 at block 416 which may comprise, for example, a step signal generated by step generator 310. The step response of channel 110 may be measured at block 418.

In one embodiment, such a measurement may involve equivalent time (ET) sampling in which oscilloscope 100 is operated in an equivalent time sampling mode, and a step response of channel is determined at least in part using averaging and/or decimation, although the scope of the claimed subject matter is not limited in this respect. Such an equivalent time sampling method and apparatus therefor may comprise the method and/or apparatus described in U.S. Pat. No. 5,978,742, although the scope of the claimed subject matter is not limited in this respect. In one embodiment, an equivalent time sampling mode may be utilized followed by an averaging mode of the real time scope signal to acquire a waveform with a higher measurement accuracy. Likewise, the acquired waveform may be decimated to a real-time sampling rate, which optionally may involve applying an anti-aliasing filter, although the scope of the claimed subject matter is not limited in this respect.

In one particular embodiment, in which a step signal generated by step generator 310 may have a discontinuity, a window function optionally may be applied at block 420 before the response of enhancement filter 120 is calculated, for example, by a deconvolution technique or by a cross-correlation technique. In one embodiment, a window function utilized at block 420 may be selected to have a narrow main lobe while the side lobes have sufficiently smaller magnitude, for example, using a Blackman-Harris type window function, although the scope of the claimed subject matter is not limited in this respect. A response for enhancement filter 120 may be calculated at block 422 to arrive at enhancement filter coefficients 316 which may be programmed into oscilloscope 100. After calibration, oscilloscope 100 may be optionally operated at block 426 using enhancement filter coefficients 316, thus the bandwidth of oscilloscope 100 may be enhanced as compared to operation without using enhancement filter 120, although the scope of the claimed subject matter is not limited in this respect.

In one embodiment, coefficients of desired filter response 314 may be convolved with acquisitions of a signal applied to a channel 110 by oscilloscope 100 during run time computed for one or more supported attenuation settings and/or channel settings, and stored for later use. Enhancement filter coefficients 316 may be obtained using a block least square process, for example. A block least square process may involve receiving as an input signal as a vector, d, which may include the impulse response for the selected desired filter response 314 and a vector, x, which may include an acquired impulse response of channel 110. For bandwidth enhancement, a desired filter response 314 may comprise at least approximately linear phase, for example to reduce pulse shape distortion, using a modified Gaussian type function, for example. For optical filters for Synchronous Optical Network (SONET) and/or Fibre Channel Standard applications such as promulgated by the American National Standards Institute (ANSI) working group X3T11, for example, but not limited to, in accordance with the X.3230-1994-Fibre Channel physical and signaling standard (FC-PH), a desired filter response 314 may comprise a 4th order Bessel Thompson type filter. A calibration process for bandwidth enhancement may involve applying step generator 310 connected to an input of an input on a channel 110 of oscilloscope 100 to obtain an actual channel response, x. The same or a similar process may also use an optical reference receiver filter, in which step generator 310 may be replaced with an impulse generator 312 which may be connected through an optical to electrical (O/E) converter (not shown) input of DSP 100, for example.

Given an actual response, x, a desired response, d, a filter length, L, and a number of points, N, in an autocorrelation process, the following relationship may be utilized for computing an enhancement filter, W:

| | |
|---|---|
| k := L | N + L − 1 |
| u := 0 | N + L − 1 |
| m := 0 | L − 1 |
| n := 0 | L − 1 |

The actual channel response autocorrelation matrix may be represented by R:

$$R_{m,n} := \frac{1}{N} \cdot \sum_{k} x_{k-m} \cdot x_{k-n}$$

The cross correlation vector between the actual channel impulse response and the desired impulse response may be represented by P:

$$P_n := \frac{1}{N} \cdot \sum_{k} d_k \cdot x_{k-1}$$

The vector, W, may include enhancement filter coefficients 316, which in this case comprise FIR filter coefficients, and may be computed as:

$$W := R^{-1} P$$

Enhancement filter coefficients 316 may be stored in oscilloscope 100 and implemented with enhancement filter 120 if bandwidth enhancement for oscilloscope 100 is in operation.

In one or more embodiments, enhancement filter 120 may be utilized to provide an enhanced channel response for one or more channels 110 of oscilloscope 100 in which enhancement filter 120 may be implemented using digital signal processing techniques. If in operation, such an enhancement filter 120 may, among other things, extend the bandwidth of channel 110, flatten a frequency response of channel 110, provide a more linear phase response for channel 110, and/or may provide a better match between the responses of two or more channels 110. Furthermore, enhancement filter 120 may also decrease rise time and/or may provide a more ideal time domain step response. In one embodiment, enhancement filter 120 may be initially calibrated for one or more channels 110 and/or for one or more attenuation settings such as 50 mV per division, 100 mV per division, and/or 200 mV per division, for example. In one embodiment, for attenuation settings less then 50 mV per division, enhancement filter 120 may also utilize enhancement filter coefficients 316 for the 50 mV per division setting, for example. Furthermore, for attenuation settings greater then 200 mV per division, enhancement filter 120 may also utilize enhancement filter coefficients 316 for the 200 mV per division attenuation setting. In one or more embodiments, enhancement filter 120 may operate at a base sample rate of 20 gigasamples per second (GS/s) and/or higher equivalent time and/or interpolated sample rates. Enhancement filter 120 may be applied prior to putting data into an equivalent time acquisition record and may be utilized, for example, with eye diagram displays, although the scope of the claimed subject matter is not limited in this respect.

Figure 5:
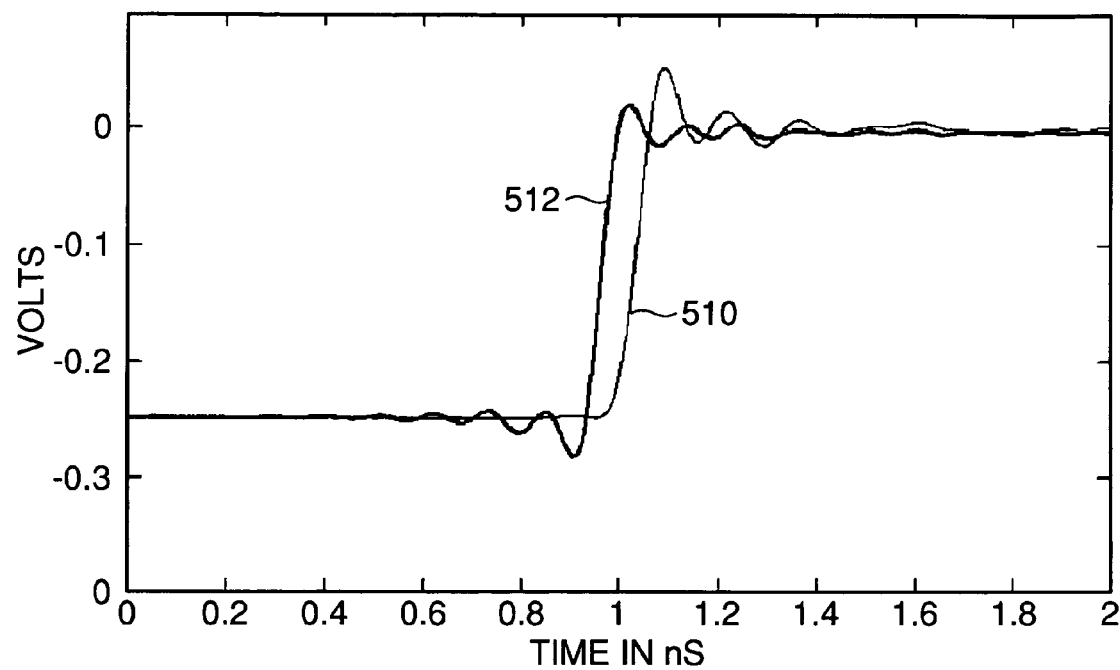
FIG. 5 is a graph showing a time domain step response of a channel of an oscilloscope comparing the step response of an oscilloscope not including an enhancement filter and with an enhancement filter in accordance with one or more embodiments.

Referring now to FIG. 5, a graph showing a time domain step response of a channel of an oscilloscope comparing a step response not including an enhancement filter with a step response including an enhancement filter in accordance with one or more embodiments will be discussed. As shown in FIG. 5, a time domain step response without enhancement filter 120 is shown at plot 510, and a time domain step response with enhancement filter 12 is shown at plot 512. In FIG. 5 the vertical axis represents voltage in volts and the horizontal axis represents time in nanoseconds (ns). In one embodiment, enhancement filter 120 may reduce overshoot and may decrease rise time, as illustrated by a comparison between plot 510 and plot 512. Furthermore, enhancement filter 120 may also add some "pre-shoot" that may be the result of Gibbs phenomenon in which the bandwidth of an enhancement filter is such that some of the upper harmonics of a step signal may not be present. The amount of acceptable pre-shoot versus providing a more accurate linear phase response and faster rise time may be a trade off for a desired filter response 314, for example where it is desired to provide a more accurate rise time measurement, although the scope of the claimed subject matter is not limited in this respect.

Figure 6:
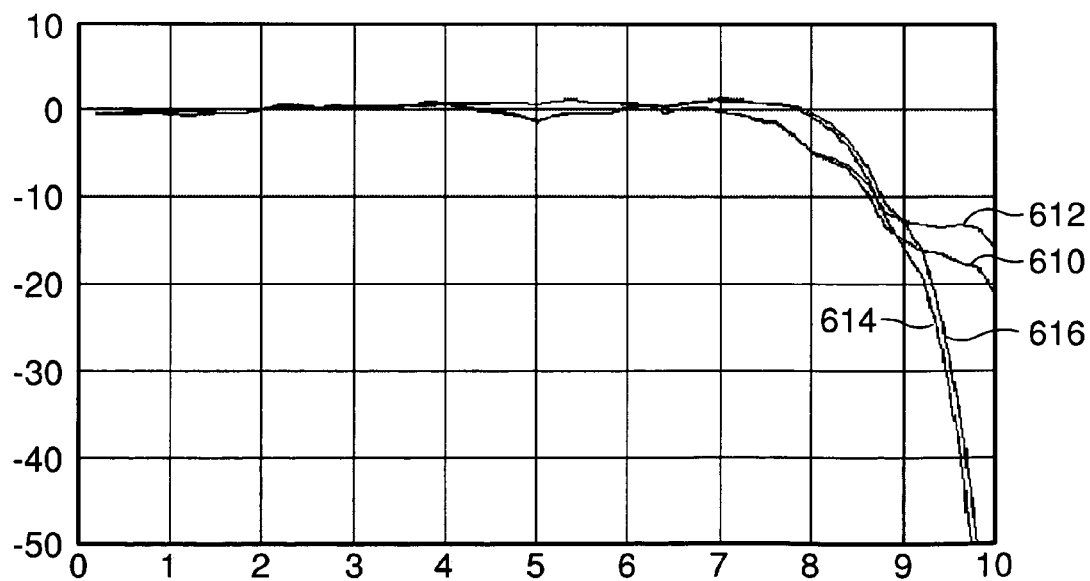
FIG. 6 is a graph showing a comparison of a frequency response between a channel of an oscilloscope not including an enhancement filter and with an enhancement filter in accordance with one or more embodiments.

Referring now to FIG. 6, a graph showing a comparison of a frequency response between a channel of an oscilloscope not including an enhancement filter with a frequency response including an enhancement filter will be discussed. As shown in FIG. 6, the vertical axis represents magnitude in dB, and the horizontal axis represents frequency in gigahertz (GHz). Plot 610 represents a channel frequency response in an interpolated acquisition (IT) mode with enhancement filter 120 "off", and plot 612 represents a channel frequency response in an equivalent time sampling (ET) mode with enhancement filter 120 "off". Plot 614 represents a channel frequency response in an IT mode with enhancement filter 120 "on", and plot 616 represents the channel frequency response in an ET mode with enhancement filter 120 "on". Interpolated acquisition (IT) mode may involve the use of a sinx/x interpolation filter that is computed in parallel with enhancement filter 120, although the scope of the claimed subject matter is not limited in this respect. Such an IT mode may result in a slightly different frequency response for channel circuit 200 as shown in FIG. 6. In one embodiment, plots 614 and 616 with enhancement filter 120 may exhibit a roll off characteristic before the 10 GHz Nyquist point. This may remove at least some of the aliasing effects that are exhibited by plots 610 and 612. As can be seen in FIG. 6, an interpolation filter used in an IT mode may have a small influence on bandwidth enhancement, although the scope of the claimed subject matter is not limited in this respect.

Referring now to FIG. 7, a graph depicting a phase response of a channel of an oscilloscope including no enhancement filter compared with the phase response of a channel including an enhancement filter in accordance with one or more embodiments will be discussed. As shown in FIG. 7, the vertical axis represents the phase in radians, and the horizontal axis represents frequency in gigahertz (GHz). Plots 710 represent a phase response of four channels 110 of oscilloscope 100 with enhancement filter 120 "off", and plots 712 represent a phase response of four channels 110 of oscilloscope 100 with enhancement filter 120 "on". As can be seen from a comparison of plots 710 with plots 712, utilization of enhancement filter 120 may provide greater phase linearity over the passband of channels 110 up to approximately 8 GHz, which may provide less pulse distortion through channels 110 and/or which may further provide more accurate spectral analysis measurements regarding phase, although the scope of the claimed subject matter is not limited in this respect.

Referring now to FIG. 8, a graph depicting an expanded view of a time domain step response of a channel of an oscilloscope with no enhancement filter compared with a time domain step response of the channel including an enhancement filter in accordance with one or more embodiments will be discussed. As shown in FIG. 8, the vertical axis represents magnitude in volts, and the horizontal axis represents time in nanoseconds (ns). Plots 810 represent a time domain step response of four channels 110 of oscilloscope 100 including no enhancement filter 120, and plots 812 represent a time domain step response of four channels 110 of oscilloscope 100 including enhancement filter 120. As can be seen from a comparison of plots 810 with plots 812, enhancement filter 120 may provide a higher degree of matching between channels 110, and/or may provide a closer step shape in plots 812 than in plots 810, although the scope of the claimed subject matter is not limited in this respect.

Although the claimed subject matter has been described with a certain degree of particularity, it should be recognized that elements thereof may be altered by persons skilled in the art without departing from the spirit and/or scope of the claimed subject matter. It is believed that an oscilloscope having an enhanced bandwidth filter and/or many of its attendant advantages will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method to calibrate an oscilloscope, comprising:
calculating an enhancement filter response based at least in part on a response of a channel of said oscilloscope and a selected filter response; and
storing the enhancement filter response;
wherein said calculating includes selecting an at least approximately linear phase response for the enhancement filter response.

2. A method to calibrate an oscilloscope, comprising:
calculating an enhancement filter response based at least in part on a response of a channel of said oscilloscope and a selected filter response; and
storing the enhancement filter response;
wherein calculating includes at least one of a cross-correlation, a deconvolution in a time domain, a deconvolution in a frequency domain, or a hormomorphic deconvolution method.

3. A method to calibrate an oscilloscope, comprising:
selecting a desired filter response of the oscilloscope;
calculating an enhancement filter response based at least in part on a response of a channel of said oscilloscope and a selected filter response; and
storing the enhancement filter response;
applying a calibration signal to a channel of the oscilloscope; and
measuring a step response of the channel in response to said applying;
said measuring including operating said oscilloscope in at least one of an equivalent time sampling mode or an interpolated time mode, and further comprising utilizing an anti-aliasing filter for decimation to a real-time sample rate.

4. A method to calibrate an oscilloscope, comprising:
calculating an enhancement filter response based at least in part on a response of a channel of said oscilloscope and a selected filter response; and
storing the enhancement filter response;
said calculating including utilizing a least square process to obtain enhancement filter coefficients for the enhancement filter response.

5. A method to calibrate an oscilloscope, comprising:
calculating an enhancement filter response based at least in part on a response of a channel of said oscilloscope and a selected filter response;
storing the enhancement filter response; and
further comprising measuring a step signal applied to the channel, and convolving the step signal with an impulse response of the channel to arrive at a desired step response of the channel.

6. An apparatus, comprising:
an oscilloscope having a response calibrated by:
calculating an enhancement filter response based at least in part on a response of a channel of said oscilloscope and a selected filter response; and
storing the enhancement filter response;
wherein said calculating includes selecting an at least approximately linear phase response for the enhancement filter response.

7. An apparatus, comprising:
an oscilloscope having a response calibrated by:
calculating an enhancement filter response based at least in Dart on a response of a channel of said oscilloscope and a selected filter response; and
storing the enhancement filter response;
wherein calculating includes at least one of a cross-correlation, a deconvolution in a time domain, a deconvolution in a frequency domain, or a hormomorphic deconvolution method.

8. An apparatus, comprising:
an oscilloscope having a response calibrated by:
selecting a desired filter response of the oscilloscope;
applying a calibration signal to a channel of the oscilloscope;
measuring a step response of the channel in response to said applying;

calculating an enhancement filter response based at least in part on a response of a channel of said oscilloscope and a selected filter response; and storing the enhancement filter response;

said measuring including operating said oscilloscope in at least one of an equivalent time sampling mode or an interpolated time mode.

9. An apparatus, comprising:

an oscilloscope having a response calibrated by:

calculating an enhancement filter response based at least in part on a response of a channel of said oscilloscope and a selected filter response; and storing the enhancement filter response;

said calculating including utilizing a least square process to obtain enhancement filter coefficients for the enhancement filter response.

* * * * *